United States Patent [19]

Chiu et al.

[11] Patent Number: 5,538,914
[45] Date of Patent: Jul. 23, 1996

[54] LDD METHOD OF CODING MASK ROM DEVICE AND LDD CODED MASK ROM DEVICE PRODUCED THEREBY

[75] Inventors: Yen-Long Chiu; Kuo-Chin Hsu, both of Hsin-chu, Taiwan

[73] Assignee: Taiwan Semiconductor Manufacturing Company, Hsinchu, Taiwan

[21] Appl. No.: 509,752

[22] Filed: Aug. 3, 1995

[51] Int. Cl.⁶ .................................. H01L 21/8246
[52] U.S. Cl. .................. 437/48; 437/34; 437/44
[58] Field of Search .................. 437/34, 45, 48, 437/57, 149, 150

[56] References Cited

U.S. PATENT DOCUMENTS

| | | | |
|---|---|---|---|
| 4,892,841 | 1/1990 | Iwase et al. | 437/48 |
| 5,002,896 | 3/1991 | Naruke | 437/48 |
| 5,091,329 | 2/1992 | Bekkering et al. | 437/48 |
| 5,200,355 | 4/1993 | Choi et al. | 437/52 |

Primary Examiner—Chandra Chaudhari
Attorney, Agent, or Firm—George O. Saile; Graham S. Jones, II

[57] ABSTRACT

A CMOS Mask ROM semiconductor device is formed in P-well NMOS region of a silicon semiconductor substrate with FOX regions on the surface thereof. A method of forming the device includes forming gate oxide over the substrate between FOX regions; forming a control gate layer over the gate oxide. Then form a gate mask over the device with and pattern a gate electrode and the gate oxide layer by etching through mask openings. Next, form an LDD mask over the device exposing the gate. Ion implant a P type dopant of a first dosage level through mask openings forming reverse type LDD implant doped P type regions. Form spacers adjacent to the electrode over the substrate. Ion implant an N type dopant of a second dosage level through the opening in the mask and aside from the spacers and the electrode into exposed portions of the substrate. The N type doped regions are thus self-aligned with the spacers and the gate and they provide a second dosage level in the substrate, the second dosage level being substantially different from the first dosage level.

19 Claims, 4 Drawing Sheets

LDD METHOD OF CODING MASK ROM DEVICE AND LDD CODED MASK ROM DEVICE PRODUCED THEREBY

BACKGROUND OF THE INVENTION

1. Field of the Invention

This invention relates to semiconductor read only memory devices and more particularly to method of coding of a Mask ROM device and the devices produced thereby.

2. Description of Related Art

U.S. Pat. No. 5,002,896 of Naruke for "Mask-ROM Manufacturing Method that Enhances Integration Density" and U.S. Pat. No. 5,200,355 of Choi for "Method for Manufacturing a Mask-Read Only Memory Device" show Mask ROM process/resulting structures, but do not show the LDD coding feature.

In a conventional method of manufacture of a MASK ROM device, at least, one extra process step is required to define a coded device. The extra process step increases the manufacturing process cycle time.

SUMMARY OF THE INVENTION

PROBLEM:

1) Most common prior art coding methods provide coding by implanting through a "SAC-OX" (sacrificial oxide) process or by implanting through "POLY" (polysilicon)

2) Implanting through SAC-OX has too long a cycle time. Implanting through POLY involves the concern about GOX (gate oxide) degrading and requires a high energy implant tool.

Each of the above two methods needs additional code photolithography and code implant processes.

A LDD (Lightly Doped Drain) process is used to code a device permitting the elimination of a process step (including the code photolithography and code implantation,) and puts the WIP (Wafer In Progress) from the SAC-OX bank to LDD stage to reduce the cycle time except for the special NLDD and PLDD masks for each special code.

In accordance with this invention coding of a ROM device is made using a reverse type LDD ion implanting.

1) Accordingly, it is possible to eliminate the coding process step (including code-photolithography and code-implanting process.

2) A coded device is defined "normally-off" when the LDD is implanted by reverse type to increase $V_T$. (for example: the 20/0.9 (width(μm)/length(μm)) NMOS's $V_T$ with PLDD implant can reach more than 5 Volts)

3) For each special code, NLDD and PLDD masks are made. An object of this invention is a reverse type LDD implant used to increase $V_t$.

Another object of this invention is use of the above characteristic for device coding of a mask ROM.

The problems solved are as follows:

1. Elimination of a process step of coding is the goal. A process in accordance with this invention permits elimination of a process step (including code-photolithography and code-implanting processes.)

2. The Wafer In Process (WIP) bank stage can be put into the LDD stage to reduce cycle time.

In accordance with this invention a CMOS Mask ROM semiconductor device and a method of manufacture thereof is provided. The device is formed in P- well NMOS region of a silicon semiconductor substrate with field oxide regions on the surface thereof.

The method of forming a MASK ROM device in accordance with this invention comprises the steps as follows:

Form a gate oxide layer over the substrate between the field oxide regions. Form a control gate electrode layer at least over the gate oxide layer. Form a control gate mask over the device, the mask having openings therethrough. Pattern a control gate electrode and the gate oxide layer by etching the control gate electrode layer and the gate oxide layer by etching through the openings in the mask. Form a lightly doped drain, LDD, mask over the device exposing the control gate. Ion implant a first, P type dopant of a first dosage level through the openings in the mask to form reverse type LDD implant doped P type regions of a first dosage level in the substrate. Form spacers adjacent to the control gate electrode over the substrate. Ion implant a second, N type dopant of a second dosage level through the opening in the mask and aside from said spacers and said control gate electrode into exposed portions of the substrate. The N type doped regions are thus self-aligned with the spacers and the control gate and they provide a second dosage level in the substrate, the second dosage level being substantially different from the first dosage level.

In accordance with another aspect of the invention, a MASK ROM semiconductor device is formed on a doped semiconductor substrate with field oxide regions on the surface thereof. A gate oxide layer and a control gate electrode layer over the gate oxide layer are formed over a P-doped region of the substrate. Spacers are formed adjacent to the control gate electrode over the substrate. Lightly doped drain, LDD, reverse doped regions are provided in the substrate beneath the spacers. The LDD regions have been doped with a first dopant to a first dosage level. A second dopant of a second dosage level is ion implanted into exposed portions of the substrate self-aligned with the control gate and the spacers providing doped regions of a second dosage level in the substrate. The second dosage level is different from the first dosage level.

Preferably, the first implant dopant comprises a dopant selected from the group consisting of $B^{11}$, $BF_2$ P type dopant ions implanted at an energy of from about 35 keV to about 65 keV at a dose of from about 1 E 13 ions/cm$^2$ to about 1 E 14 ions/cm$^2$; and the second implant dopant comprises ions selected from the group consisting of phosphorous and arsenic N type ions implanted at an energy of from about 50 keV to about 100 keV at a dose of from about 1 E 14 ions/cm$^2$ to about 1 E 15 ions/cm$^2$.

Preferably, the first implant dosage concentration is from about 1 E 16 atoms/cm$^3$ to about 1 E 18 atoms/cm$^3$ and the second implant dosage concentration is from about 1 E 19 atoms/cm$^3$ to about 1 E 21 atoms/cm$^3$.

Preferably, the value of $V_T$ is at least 4 Volts.

Preferably, $V_T$ has a value of about 15 Volts, the PLDD implant comprises $BF_2$ implanted at an energy of about 50 keV with a dose of about 5 E 12 ions/cm$^2$.

The device is formed in P- well NMOS region of a silicon semiconductor substrate with field oxide regions on the surface thereof is provided.

The foregoing and other aspects and advantages of this invention are explained and described below with reference to the accompanying drawings, in which:

DESCRIPTION OF THE PREFERRED EMBODIMENT THE PROBLEM

FIGS. 1A–1E show steps illustrative of a process of forming a Mask ROM in the NMOS portion of a CMOS device, illustrating the problem solved by the present invention. The process of FIGS. 1A–1E is employed for manufacturing a Mask ROM device 10.

Figure 1A:
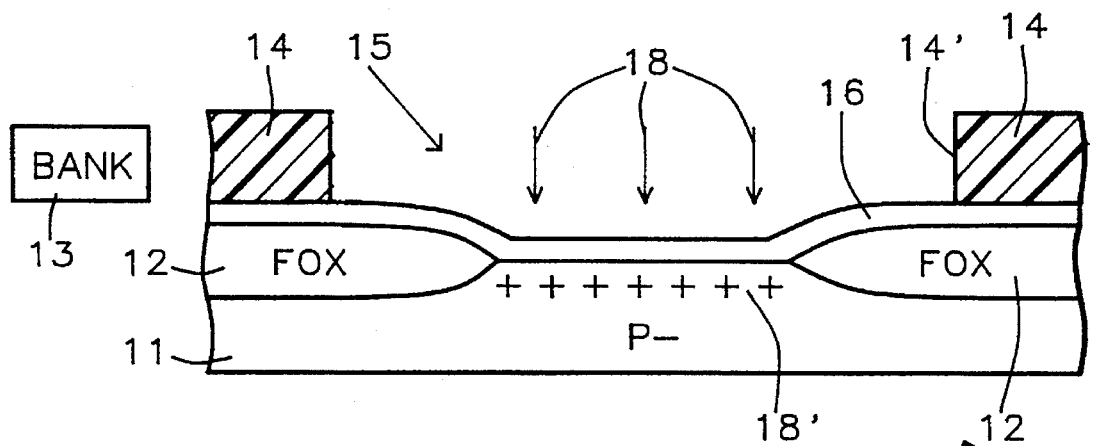
FIGS. 1A–1E show steps illustrating a process of forming a Mask ROM in the NMOS portion of a CMOS device.

FIG. 1A shows a fragment of the device 10 in an early stage of its manufacture. The device 10 is formed on a P-type silicon semiconductor substrate 11.

The bank 13 is the source of the partially processed memory devices 10 shown in FIG. 1A. Bank 13 illustrates the stock of many lots of partially processed memory devices which have previously been run from the beginning of the ROM manufacturing process up to the SAC-OX step where the bank 12 of devices 10 await coding. The bank 13 contains an inventory of the lots of partially processed memory devices 10 wait in the bank 13 for the customer's code. When the customer orders a specific code, then the lots in the bank 13 are used and the process is completed using the run code photolithographic mask 14 with an opening 14' located in the desired location on the ROM and the code implant ions 18 are implanted through opening 14' to define the code in the device.

Referring again to FIG. 1A, a pair of field oxide regions 12 are formed on either end of the portion of device 10 shown in FIG. 1A. Field oxide regions 12 frame the central section 15 of the fragment of device 10 which is shown. A sacrificial oxide (silicon dioxide) layer 16 is formed on the surface of substrate 11 covering the field oxide regions 12, as well, Just before the deposition of the photoresist of the code mask. A photoresist code mask 14 is formed over the device 10 with an opening 14' centered over the central section 15 covering the margins of the FOX regions 12. That is to say that the photoresist mask 14 has its opening 14' formed centered over the area framed by the field oxide regions 12.

Then with the mask 14 and the sacrificial oxide layer 16 remaining in place, P or N type ions 18 are implanted through opening 14' in mask 14 into the region 18' beneath the surface of substrate 11 in central region 15 between FOX regions 12 to either turn the code implant on or off. If the code device (region 18') is to be defined normally OFF, then P type ions 18 are implanted through opening 14', as indicated by the array of "+" signs shown in region 18'. If the code device (region 18') were to be defined normally ON, then a corresponding N type array of ions "−" would have been implanted in place of the dopant indicated by the array of "+" signs in region 18'.

Figure 1B:
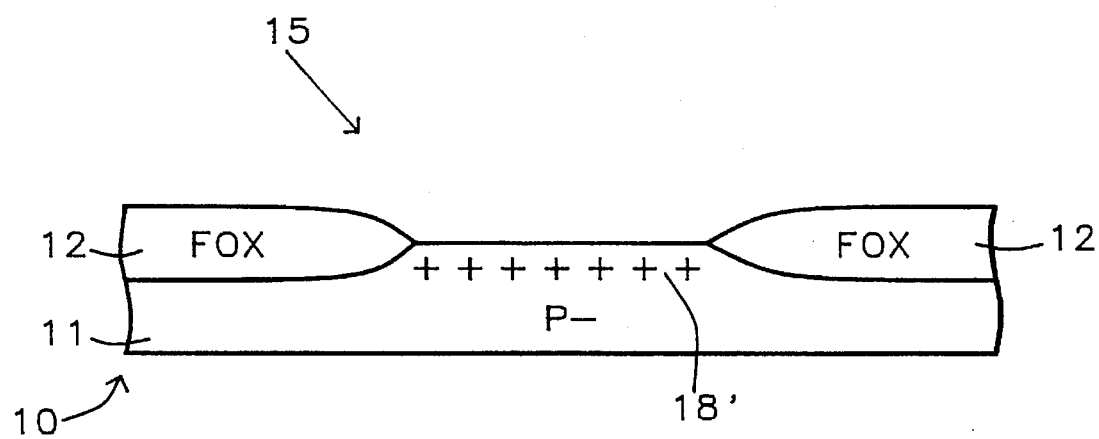

In FIG. 1B, the device 10 of FIG. 1A is shown after the mask 14 and the sacrificial oxide layer 16 have been stripped from the device 10.

Figure 1C:
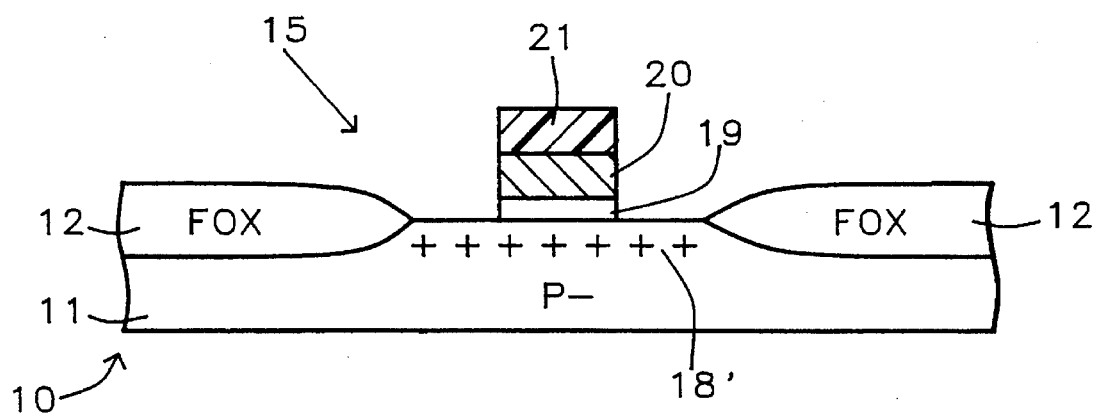

In FIG. 1C, the device 10 of FIG. 1B is shown after a blanket gate oxide layer has been formed over the exposed portion of the substrate 11, followed by formation of a blanket polysilicon layer for formation of control gate electrode 20. Upon the blanket polysilicon layer a gate electrode photoresist mask 21 was been formed and then patterned to cover the location of a gate electrode over the central portion of the region 15. With the gate electrode mask 21 in place an etching process was performed on the blanket gate oxide layer and the blanket polysilicon gate electrode layer to form the control gate electrode 20 shown and gate oxide layer 19 shown patterned (by the etching process) with both lying beneath the gate electrode mask 21. The processing was performed in a conventional fashion.

Figure 1D:
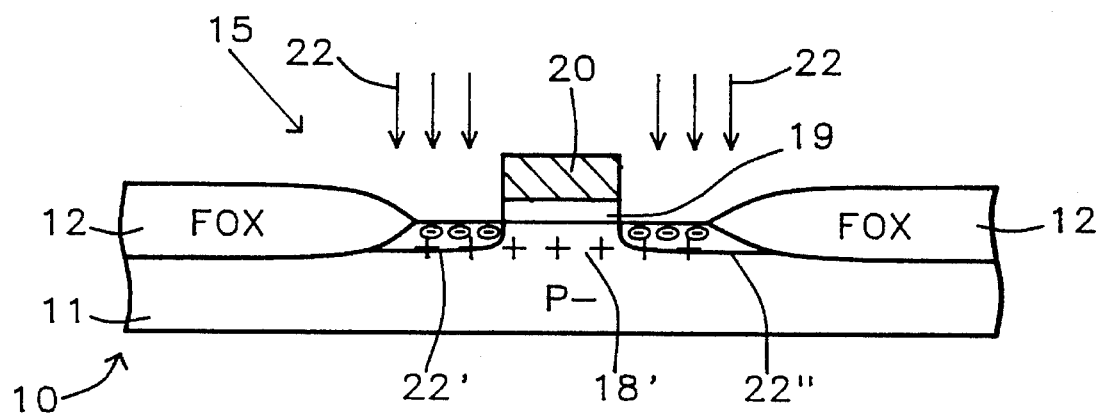

In FIG. 1D, the device 10 of FIG. 1C is shown after mask 21 has been removed and after ion implantation of lightly doped N type ions 22 in an NLDD (N-type Lightly Doped Drain) process leaving negative dopant as indicated in regions 22' and 22" self-aligned with control gate electrode 20. FIGS. 1A–1E shows a coding method with limitations of conventional coding methods, as employed in a conventional NMOS NLDD implant. The NLDD implant step is mentioned to compare it with the improved NLDD coding method of this invention, because in this method, the code device is implanted with reverse type ions to increase the $V_T$. The result of the implantation of ions 22 is the formation of shallow LDD source region 22' and LDD drain region Juxtaposed (side-by-side) with gate electrode 20 which serves as a self-aligned mask blocking implantation of ions 22 in the channel region of substrate 11 beneath gate electrode 20. The FOX region 12 also masks the regions of substrate 11 away from the central region 15.

To perform the implant of the PLDD doped regions of the PMOS portion of a CMOS device a corresponding "PLDD" photolithography step is performed next, but is not shown because the mask used is dark (not open) in the NMOS regions shown in FIGS. 1A–1E. Then a PLDD ion implanting is performed into the N-well of the CMOS device as is well known by those skilled in the art.

Figure 1E:
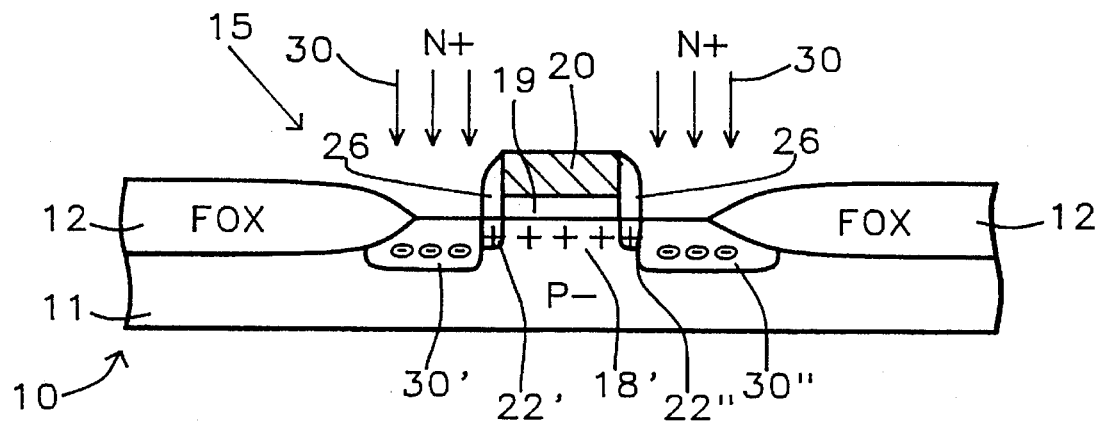

In FIG. 1E, the device 10 of FIG. 1D is shown after the formation of silicon dioxide spacers 26 by a conventional process of blanket deposition of a silicon dioxide layer (not shown) followed by etching back the silicon dioxide layer leaving the spacers 26 Juxtaposed with the lateral edges of the control gate electrode 20 and the gate oxide layer 19 beneath electrode 20.

In addition ion implantation of N+ ions 30 into substrate 11, self-aligned with the spacers 26 is shown through and below the LDD regions 22' and 22" which are exposed (not covered by the gate electrode 20 or the spacers 26,) forming negative "−" type doped source region 30' and negative "−" type doped drain region 30" extending below the LDD regions 22' and 22". The electrode 20 also serves as a self-aligned mask blocking implantation of ions 30 in the channel region of substrate 11, where region 18' remains doped with positive "+" dopant, beneath electrode 20. FOX regions 12 also mask the remaining regions of substrate 11 covered by FOX regions 12 away from the central region 15 from doping thereof with the ions 30.

PREFERRED EMBODIMENT

FIGS. 2A–2E show steps illustrative of a process in accordance with this invention for forming a Mask ROM in the NMOS portion of a CMOS device for solving the problem illustrated by the process of FIGS. 1A–1E.

Figure 2A:
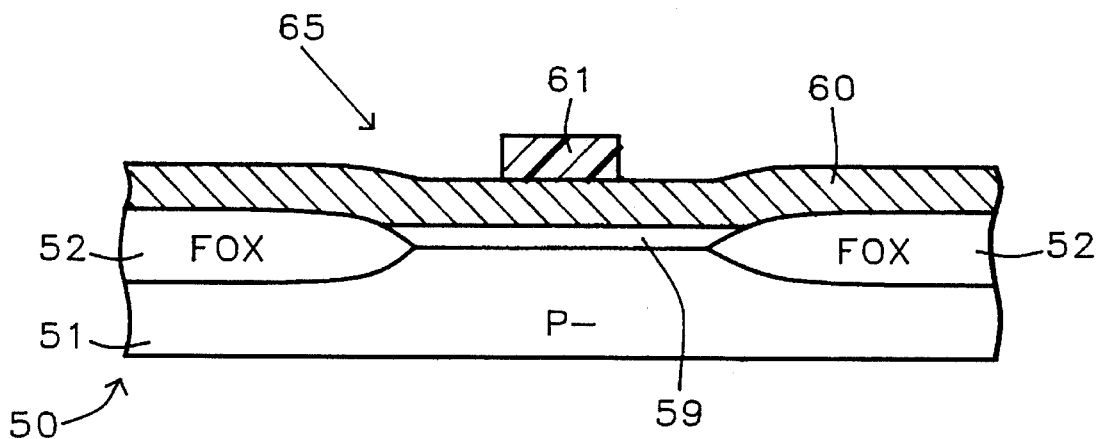
FIGS. 2A–2E show steps illustrative of a process in accordance with this invention for forming a Mask ROM in the NMOS portion of a CMOS device.

FIG. 2A shows a fragment of a CMOS device 50 in accordance with this invention during an early stage of its manufacture. The device 50 is formed on a P-type silicon semiconductor substrate or P-well 51.

In an early step in the process, a pair of field oxide regions 52 are formed on either end of the portion of device 50 shown in FIG. 2A. Field oxide regions 52 frame the central section 65 of the fragment of device 50 which is shown.

Then a blanket, gate oxide layer 59 is formed over the exposed portion of the substrate or P-well 51 (between FOX regions 52), followed by formation of a blanket polysilicon layer 60 (for formation of a gate electrode) covering the entire device 50, upon which a gate electrode photoresist mask 61 was formed. The gate electrode photoresist mask 61 is patterned to define and to cover the location of a gate electrode 60' (as shown in FIG. 2B) to be formed from the layer 60 below, over the central portion of the region 65.

Figure 2B:
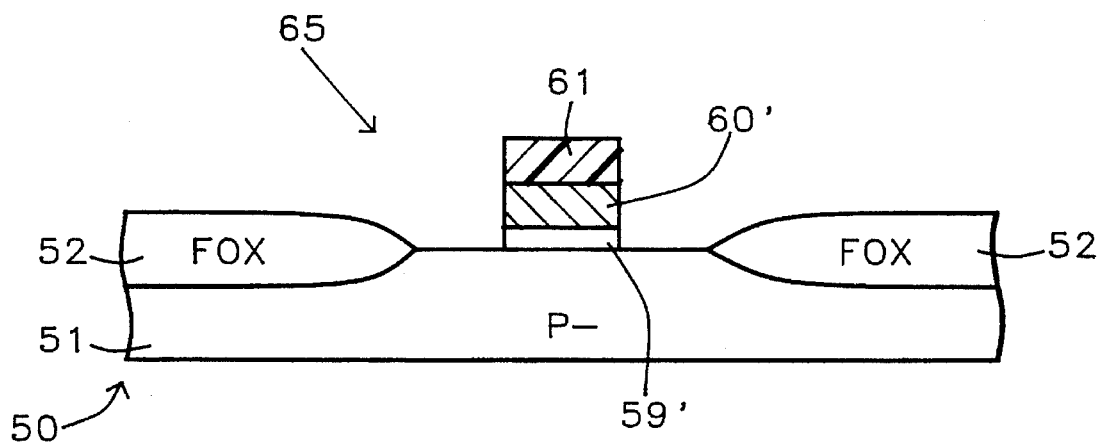

Referring now to FIG. 2B, (which can be compared with FIG. 1C) with the gate electrode mask 61 in place, a two step etching process has been performed. First the blanket polysilicon gate electrode layer 60 was etched through the openings in mask 61 leaving an array of gate electrodes similar to gate 60' (only one shown for convenience of illustration) beneath mask 61. Then the second etching step shaped the blanket gate oxide layer 59 into the pattern of the gate oxide region 59' which is aligned with gate electrode 60'. All that remains of layers 59 and 60 are the gate electrode 60' and the gate oxide region 59', which lie beneath the gate electrode mask 61 between the FOX regions 52 and resting on substrate or P-well 51. This two step etching process is performed in a conventional fashion using a reactive ion etching (RIE) process for the polysilicon layer 60 for the gate oxide layer 59.

Note that unlike FIGS. 1A–1C, the P- substrate or well 11 of FIGS. 2A and 2B has not been doped with dopant 18'.

During the NLDD process to be performed on the NMOS peripheral circuits (where the mask is open) portions of a CMOS device the NLDD mask is dark (not open) over the portion of the device shown in FIGS. 2A–2E.

Figure 2C:
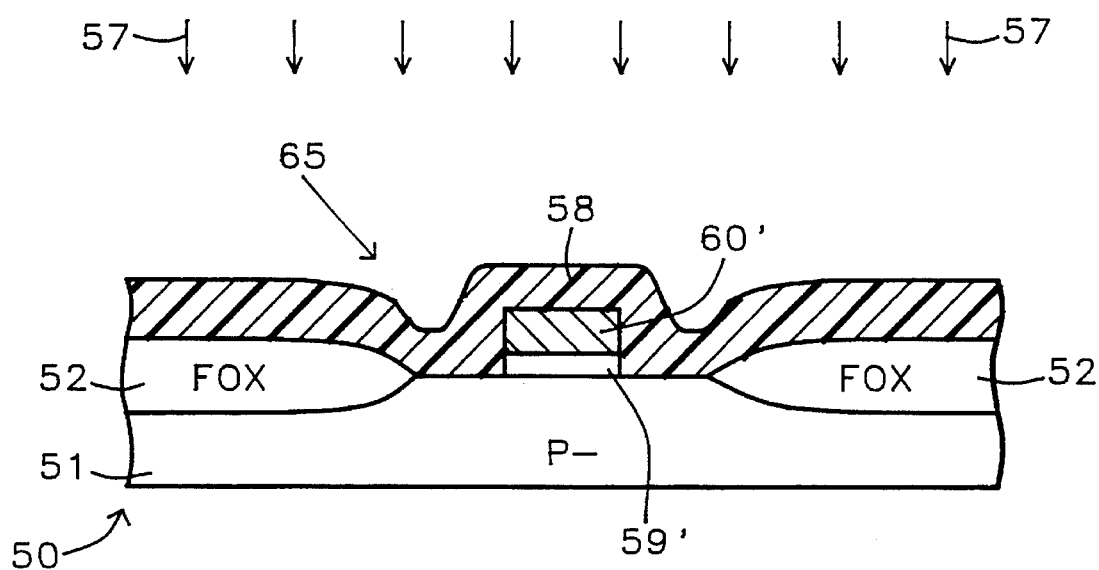

In this case of FIG. 2C a source of partially processed memory devices is shown in a bank 53, employed analogously to the bank 13 shown in FIG. 1A, but which is not included in FIG. 2A. That bank also represents the stock of many lots of partially processed memory devices which have previously been run from the beginning of the ROM manufacturing process up to the SAC-OX step where the bank 12 of devices 10 await coding. The bank 13 contains an inventory of the lots of partially processed memory devices 10 wait in the bank 13 for the customer's code. When the customer orders a specific code, then the lots in the bank 13 are used and the process is completed using the run code photolithographic mask 14 with an opening 14' located in the desired location on the ROM and the code implant ions 18 are implanted through opening 14' to define the code in the device.

FIG. 2C shows the device 50 of FIG. 2B after mask 61 hams been removed, and a new NLDD photolithographic mask 58 has been formed covering the entire portion of device shown in FIG. 2B so that the mask is dark over that region (not open) and no NLDD doping is performed in that region unlike the more conventional approach shown in FIG. 1D. Thus, the ions 57 directed during the NLDD doping step are prevented from reaching portion of the device 50 shown in FIG. 2C. The NLDD doping proceeds as usual in the peripheral circuits of the device 50, except that the NMOS regions are dark (not open.) In the case of a code device 50 which is to be defined as normally "OFF" then the NLDD mask 58 is dark (not open) over the device 50 of FIG. 2D.

If there is a specific code, then the NLDD mask and the PLDD masks are specified, respectively.

Figure 2D:
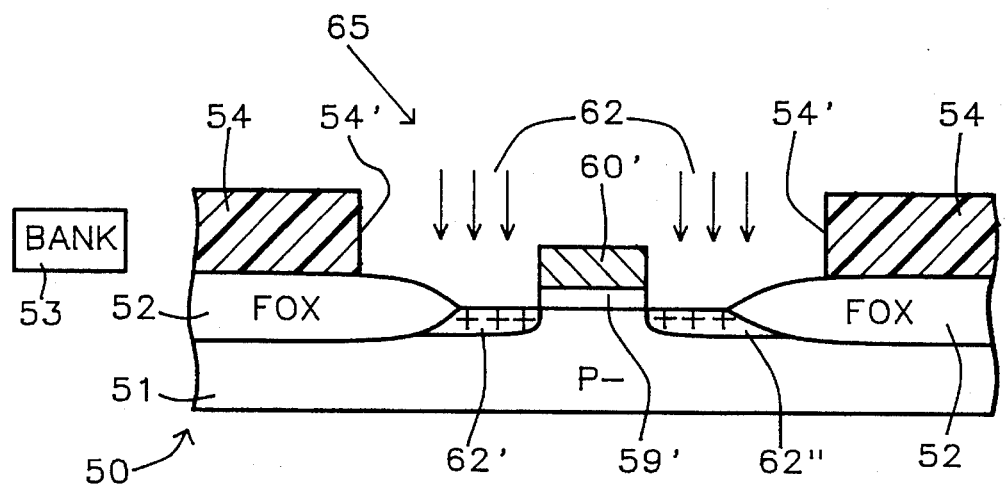

In FIG. 2D, the device 50 of FIG. 2B is shown after the NLDD mask 58 (which is not open) has been removed, and a new, PLDD (P-type Lightly Doped Drain) process, photoresist, mask 54 has been formed covering portions of the FOX regions 52 with an opening 54' leaving the central region 65 including the control gate electrode 60' and the substrate 50 between the FOX regions 52. In the case of a code device which is to be defined as normally "OFF" then the PLDD mask 54 is clear over the device 50 of FIG. 2D. Then $BF_2$ ions 62 are implanted in a PLDD implant step.

In a reverse type LDD implant, $BF_2$ ions 62 are implanted through the opening 54' in mask into exposed portions of substrate 50 (i.e. not covered by mask 54 or the gate electrode 60 or the FOX regions 52.) The $BF_2$ ions 62 are implanted with a dosage of from about 1 E 12 ions/cm$^2$ to about 1 E 14 ions/cm$^2$, (preferably 1 E 13 ions/cm$^2$) implanted at an energy of from about 35 keV to about 65 keV in an implanter tool. More broadly, the first implant dopant 62 can comprise a dopant selected from the group consisting of $B^{11}$, $BF_2$ P-type dopant ions implanted at an energy of from about 35 keV to about 65 keV at a dose of from about 1 E $^{13}$ ions/cm$^2$ to about 1 E $^{14}$ ions/cm$^2$. The result of implanting ions 62 is a pair of heavily code-doped regions 62' and 62" in the substrate or P-well 51 which are self-aligned with the control gate electrode 60'.

The result of implantation of boron fluoride $BF_2$ ions 62 in the PLDD step is the formation of shallow LDD source region 62' and LDD drain region 62" Juxtaposed (side-by-side) with gate electrode 60' which serves as a self-aligned mask blocking implantation of ions 62 in the channel region of substrate 51 beneath gate electrode 60. As stated above, the FOX regions 52 had masked the regions of substrate 51 away from the central region 65. The code-device is normally off after the PLDD implant which turns the device off.

The first implant of P-type ions 62 provides a dosage concentration of dopant in regions 62' and 62" from about 1 E 16 atoms/cm$^3$ to about 1 E 18 atoms/cm$^3$.

Note that in a PMOS device, the areas are turned off by using a N dopant in an LDD process.

Figure 2E:
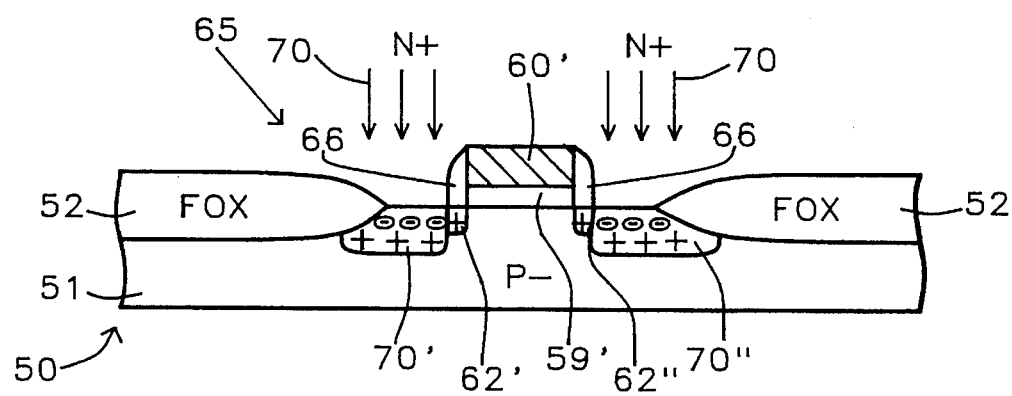

In FIG. 2E, the device 50 of FIG. 2D is shown after the formation of silicon dioxide spacers 66 by a conventional process of conventional blanket deposition of a silicon dioxide layer (not shown) followed by etching back that silicon dioxide layer leaving the spacers 66 juxtaposed with the lateral edges of the gate electrode 60' and the lateral edges of gate oxide layer 59'.

In addition, the second implant N+ ions 70 are selected from the group consisting of phosphorus and arsenic ions. Ions 70 are shown being ion implanted into, through and below the LDD regions 62' and 62" which are exposed (not covered by the gate electrode 60' or the spacers 66,) forming source region 70' and drain region 70" extending away from the gate electrode 60' and spacers 66 and down into substrate 51 below the LDD regions 62' and 62". In this case, the gate electrode 60' serves as a self-aligned mask blocking implantation of ions 60 in the channel region of substrate 51 beneath gate electrode 60. The spacers 66 block implantation of ions 60 in the substrate 51 below their locations, as well. The FOX region 52 also masks the regions of substrate 51 away from the central region 65.

The N type arsenic or phosphorus ions 70 are implanted in source region 70' and drain region 70" with a dosage of from about 1 E 15 ions/cm$^2$ to about 5 E 15 ions/cm$^2$, (preferably 3 E 15 ions/cm$^2$) implanted at an energy of from about 60 keV to about 80 keV in an implanter tool. The resulting concentration of regions 70' and 70" is present in a high concentration level from about 1 E 19 atoms/cm$^3$ to about 1 E 21 atoms/cm$^3$.

The word and bit lines in the final product are outside of the focus of the current invention, since the word and bit lines will be configured in accordance with conventional industrial products.

EXAMPLE

The value of $V_T$ is about 15 Volts with parameters of PLDD implanting of BF2 ions implanted at 50 keV at an energy of 5 E 12 ions/cm². The value of 15 Volts for $V_T$ is for the normally "OFF" design. A larger value of $V_T$ is preferred and the minimum value of $V_T$ should be at least 4 Volts.

SUMMARY

In summary, in accordance with the preferred embodiment of this invention, the NMOS code device is defined "normally off" when the NLDD implanted mask of the device is dark and the PLDD mask is clear to implant BF2 into the NMOS LDD region. In accordance with this invention the value of $V_T$ is increased by LDD code implantation. In accordance with this process, for each special code, both NLDD and PLDD masks are made.

The advantages of this process are as follows:

1. A code stage process can be saved (eliminated) including code photolithography and code implant.

2. We can put WIP (Wafers in Process) in a bank at the LDD stage to reduce cycle time.

3. This cost effective process uses only one more mask for coding while two process steps are eliminated.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of manufacturing a ROM semiconductor device formed on a doped semiconductor substrate with field oxide regions with a gate oxide layer between said field oxide regions on the surface thereof, said method comprising the steps as follows:

forming a control gate electrode over said gate oxide layer, forming a control gate mask over said device, said mask having openings therethrough, forming a lightly doped drain, LDD, mask over said device exposing said control gate, ion implanting dopant of a first dosage level through openings in said mask to form reverse type LDD implant doped regions of a first dosage level in said substrate, forming spacers adjacent to said control gate electrode over said substrate, ion implanting a dopant of a second dosage level through into exposed portions of said substrate self-aligned with said spacers and said control gate providing doped regions of a second dosage level in said substrate, said second dosage level being substantially different from said first dosage level, whereby a MASK ROM device is provided.

2. The method of claim 1 wherein said first implant dopant comprises a P type dopant selected from the group consisting of $B^{11}$, $BF_2$ dopant ions implanted at an energy of from about 35 keV to about 65 keV at a dose of from about 1 E 13 ions/cm² to about 1 E 14 ions/cm².

3. The method of claim 1 wherein said second implant dopant comprises N type dopant selected from the group consisting of phosphorous and arsenic ions implanted at an energy of from about 50 keV to about 100 keV at a dose of from about 1 E 14 ions/cm² to about 1 E 15 ions/cm².

4. The method of claim 2 wherein said first implant dopant comprises a P type dopant selected from the group consisting of $B^{11}$, $BF_2$ dopant ions implanted at an energy of from about 35 keV to about 65 keV at a dose of from about 1 E 13 ions/cm² to about 1 E 14 ions/cm², and said second implant dopant comprises N type dopant selected from the group consisting of phosphorous and arsenic ions implanted at an energy of from about 50 keV to about 100 keV at a dose of from about 1 E 14 ions/cm² to about 1 E 15 ions/cm².

5. The method of claim 1 wherein said first implant provides a dosage concentration from about 1 E 16 atoms/cm³ to about 1 E 18 atoms/cm³.

6. The method of claim 1 wherein said second implant provides a dosage concentration from about 1 E 19 atoms/cm³ to about 1 E 21 atoms/cm³.

7. The method of claim 1 wherein said first implant dopant comprises P type dopant of $BF_2$ ions implanted at an energy of from about 35 keV to about 65 keV at a dose of from about 1 E 13 ions/cm² to about 1 E 14 ions/cm², and said first implant provides a dosage concentration from about 1 E 16 atoms/cm³ to about 1 E 18 atoms/cm³.

8. The method of claim 1 wherein said second implant dopant comprises N type dopant selected from the group consisting of phosphorous and arsenic ions implanted at an energy of from about 50 keV to about 100 keV at a dose of from about 1 E 14 ions/cm² to about 1 E 15 ions/cm² said second implant providing a dosage concentration from about 1 E 19 atoms/cm³ to about 1 E 21 atoms/cm³, and the value of $V_T$ is at least 4 Volts.

9. The method of claim 1 wherein said first implant dopant comprises a P type dopant $BF_2$ dopant ions implanted at an energy of from about 35 keV to about 65 keV at a dose of from about 1 E 13 ions/cm² to about 1 E 14 ions/cm², said first implant provides a dosage concentration from about 1 E 16 atoms/cm³ to about 1 E 18 atoms/cm³, said second implant dopant comprises ions selected from the group consisting of phosphorous and arsenic N type ions implanted at an energy of from about 50 keV to about 100 keV at a dose of from about 1 E 14 ions/cm² to about 1 E 15 ions/cm² said second implant providing a dosage concentration from about 1 E 19 atoms/cm³ to about 1 E 21 atoms/cm³, and the value of $V_T$ is at least 4 Volts.

10. A method of manufacturing a CMOS Mask ROM semiconductor device formed in P- well NMOS region of a silicon semiconductor substrate with field oxide regions on the surface thereof, said method comprising the steps as follows:

forming a gate oxide layer over said substrate between said field oxide regions, forming a control gate electrode layer at least over said gate oxide layer, forming a control gate mask over said device, said mask having openings therethrough, patterning a control gate electrode and said gate oxide layer by etching said control gate electrode layer and said gate oxide layer by etching through said openings in said mask, forming a lightly doped drain, LDD, mask over said device exposing said control gate, ion implanting P type dopant of a first dosage level through said openings in said mask to form reverse type LDD implant doped P type regions of a first dosage level in said substrate, forming spacers adjacent to said control gate electrode over said substrate, ion implanting an N type dopant of a second dosage level through the opening in the mask and aside from said spacers and said control gate electrode into exposed portions of said substrate self-aligned with said spacers and said control gate providing N type doped regions of a second dosage level in said substrate, said second dosage level being substantially different from said first dosage level, whereby a MASK ROM device is provided.

11. The method of claim 10 wherein said first implant dopant comprises a dopant selected from the group consisting of $B^{11}$, $BF_2$ P type dopant ions implanted at an energy of from about 35 keV to about 65 keV at a dose of from about 1 E 13 ions/cm$^2$ to about 1 E 14 ions/cm$^2$.

12. The method of claim 10 wherein said second implant dopant comprises ions selected from the group consisting of phosphorous and arsenic N type ions implanted at an energy of from about 50 keV to about 100 keV at a dose of from about 1 E 14 ions/cm$^2$ to about 1 E 15 ions/cm$^2$.

13. The method of claim 2 wherein said first implant dopant comprises a dopant selected from the group consisting of $B^{11}$, $BF_2$ P type dopant ions implanted at an energy of from about 35 keV to about 65 keV at a dose of from about 1 E 13 ions/cm$^2$ to about 1 E 14 ions/cm$^2$, and said second implant dopant comprises ions selected from the group consisting of phosphorous and arsenic N type ions implanted at an energy of from about 50 keV to about 100 keV at a dose of from about 1 E 14 ions/cm$^2$ to about 1 E 15 ions/cm$^2$.

14. The method of claim 10 wherein said first implant provides a dosage concentration from about 1 E 16 atoms/cm$^3$ to about 1 E 18 atoms/cm$^3$.

15. The method of claim 10 wherein said second implant provides a dosage concentration from about 1 E 19 atoms/cm$^3$ to about 1 E 21 atoms/cm$^3$.

16. The method of claim 10 wherein said first implant dopant comprises a dopant $BF_2$ P type dopant ions implanted at an energy of from about 35 keV to about 65 keV at a dose of from about 1 E 13 ions/cm$^2$ to about 1 E 14 ions/cm$^2$ and said first implant provides a dosage concentration from about 1 E 16 atoms/cm$^3$ to about 1 E 18 atoms/cm$^3$.

17. The method of claim 10 wherein said second implant dopant comprises boron, $B^{11}$, implanted at an energy of from about 35 keV to about 65 keV at a dose of from about 1 E 13 ions/cm$^2$ to about 1 E 14 ions/cm$^2$, said second implant providing a dosage concentration from about 1 E 19 atoms/cm$^3$ to about 1 E 21 atoms/cm$^3$.

18. The method of claim 10 wherein said first implant dopant comprises a dopant $BF_2$ P type dopant ions implanted at an energy of from about 35 keV to about 65 keV at a dose of from about 1 E 13 ions/cm$^2$ to about 1 E 14 ions/cm$^2$, said first implant provides a dosage concentration from about 1 E 16 atoms/cm$^3$ to about 1 E 18 atoms/cm$^3$, said second implant of N type dopant comprises phosphorus implanted at an energy of from about 50 keV to about 100 keV at a dose of from about 1 E 13 ions/cm$^2$ to about 1 E 14 ions/cm$^2$, said second implant providing a dosage concentration from about 1 E 19 atoms/cm$^3$ to about 1 E 21 atoms/cm$^3$, and the value of $V_T$ is at least 4 Volts.

19. The method of claim 18 wherein $V_T$ has a value of about 15 Volts, the PLDD implant comprises $BF_2$ implanted at an energy of about 50 keV with a dose of about 5 E 12 ions/cm$^2$.

* * * * *